(12) United States Patent
Tsai et al.

(10) Patent No.: US 6,832,422 B2
(45) Date of Patent: Dec. 21, 2004

(54) APPARATUS FOR ASSEMBLING A POST-CMP CLEANING BRUSH

(75) Inventors: Ming Fa Tsai, Panchiao (TW); Chia Chi Lin, Taoyuan Hsien (TW); Shih Hsien Hsu, Yunlin Hsien (TW); Chih-Feng Wang, Taipei Hsien (TW); Hong-wei Chen, Kaohsiung (TW)

(73) Assignee: Nanya Technology Corporation, Taoyuan (TW)

( * ) Notice: Subject to any disclaimer, the term of this patent is extended or adjusted under 35 U.S.C. 154(b) by 252 days.

(21) Appl. No.: 10/153,349

(22) Filed: May 21, 2002

(65) Prior Publication Data

US 2003/0124857 A1 Jul. 3, 2003

(30) Foreign Application Priority Data

Nov. 29, 2001 (TW) ........................................ 90129509 A

(51) Int. Cl.⁷ ............................. B23P 19/02; B23P 11/02
(52) U.S. Cl. ........................ 29/235; 29/234; 29/895.23; 300/1; 15/1
(58) Field of Search ............................... 15/1; 300/1, 2, 300/21, 19; 29/451, 895.21, 895.23, 234, 235

(56) References Cited

U.S. PATENT DOCUMENTS 6,363,594 B1 * 4/2002 Jahani et al. ................. 29/235

* cited by examiner

Primary Examiner—Robert J. Warden, Sr.
Assistant Examiner—Shay L Balsis
(74) Attorney, Agent, or Firm—Ladas & Parry

(57) ABSTRACT

An apparatus for assembling a post-CMP cleaning brush. The post-CMP cleaning brush is provided with a brush core and an outer brush, and the outer brush is provided with a hollow portion. The apparatus comprises a base, a fixed member, a sliding member, a plurality of posts, and an actuating device. The base holds the brush core and the outer brush, and the fixed member is disposed on the base. The sliding member is disposed on the base in a manner such that it is located at the opposite side of the fixed member relative to the outer brush disposed on the base. The posts, disposed on the sliding member, pass through the fixed member and the hollow portion of the outer brush so as to assist the brush core in passing through the hollow portion of the outer brush. The actuating device connects with the brush core so as to pass the brush core through the hollow portion of the outer brush and separate the posts, inserted into the outer brush, from the outer brush.

16 Claims, 15 Drawing Sheets

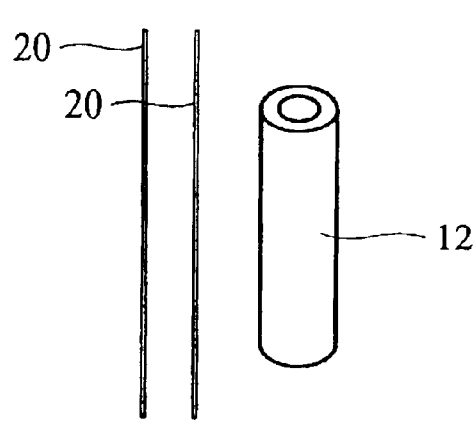
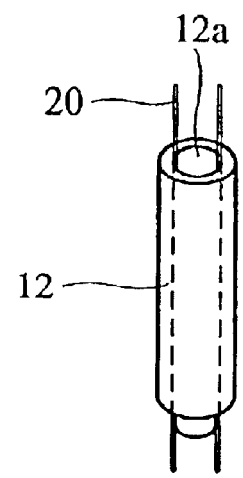
FIG.2a
(PRIOR ART)
FIG.2b
(PRIOR ART)
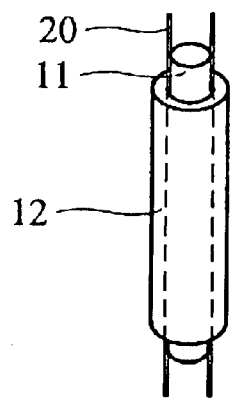
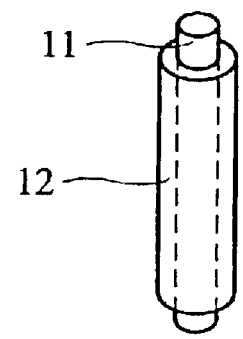
FIG.2c
(PRIOR ART)
FIG.2d
(PRIOR ART)

140
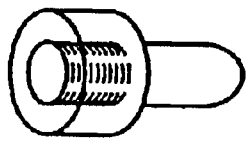
FIG. 5b
151
FIG. 5d
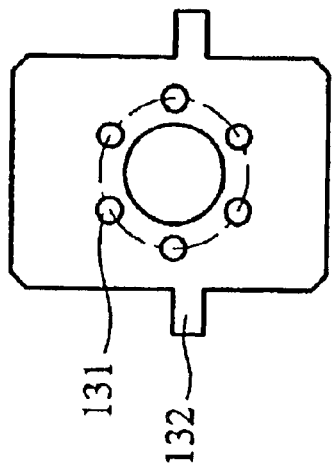
131
132
130
FIG. 5a
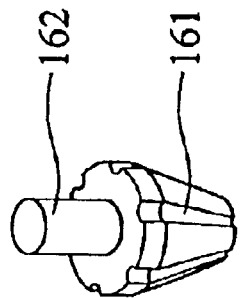
162
161
160
FIG. 5c

172

172

APPARATUS FOR ASSEMBLING A POST-CMP CLEANING BRUSH

BACKGROUND OF THE INVENTION

1. Field of the Invention

The invention relates to an apparatus for assembling a post-CMP cleaning brush; in particular, to an apparatus that can assemble the post-CMP cleaning brush more easily.

2. Description of the Related Art

As is well known, semiconductor devices are fabricated from semiconductor wafers, which are subjected to numerous processing operations. These operations include, for example, impurity implants, gate oxide generation, intermetal oxide depositions, metallization depositions, photolithography pattering, etching operations, chemical mechanical polishing (CMP), etc. Although these processes are performed in ultra clean environments, the very nature of many of the process operations is to blame for the generation of surface particles and residue. For instance, when CMP operations are performed, a film of particles and/or metal contaminants are commonly left behind.

Because surface particles can detrimentally impact the performance of an integrated circuit device, wafer-cleaning operations have become a standard procedural requirement after certain process steps. Although cleaning operations are rather procedural, the equipment and chemicals implemented to perform the actual cleaning are highly specialized. This specialization is important because each wafer, being at different stages of fabrication, represents a significant investment in terms of raw materials, equipment fabrication time, and associated research and development.

To perform the cleaning operations in an automated manner, fabrication labs employ cleaning systems. The cleaning systems typically include one or more brush boxes in which wafers are scrubbed. As shown in FIG. 1a, each brush box includes a pair of brushes 10, such that each brush 10 scrubs a respective side of a wafer 1. To enhance the cleaning ability of such brush boxes, it is common practice to deliver cleaning fluids through the brush 10 (TTB). Referring to FIG. 1b, TTB fluid delivery is accomplished by implementing brush cores 11 that have a plurality of holes that allow fluids to be fed into the brush core 11 at a particular pressure to be released into an outer brush 12 surface. The outer brush 12 surface is made out of a very porous and soft material so that direct contact with the delicate surface of a wafer 1 does not cause scratches or other damage. Typically, the outer brush 12 surface is made out of polyvinyl alcohol (PVA) foam. Although, other materials such as nylon, mohair or a mandrel wrapped with a polishing pad material can be used. It is noted that the outer brush 12 is provided with a hollow portion 12a for the brush core 11 in passing through.

The outer brush 12 must be replaced after cleaning a predetermined number of wafers 1. The conventional method for assembling a new outer brush 12 and the brush core 11 is shown in FIG. 2a, FIG. 2b, FIG. 2c, and FIG. 2d. Firstly, two pads 20, shown in FIG. 2a and made of PVC, are passed through the hollow portion 12a of the outer brush 12 as shown in FIG. 2b. Then, the hollow portion 12a of the outer brush 12 is expanded by pulling the pads 20 while the brush core 11 is passed through the hollow portion 12a of the outer brush 12 as shown in FIG. 2c. Finally, the pads 20 are drawn out of the hollow portion 12a of the outer brush 12 to complete the assembly of the post-CMP cleaning brush 10.

The conventional assembly method has the following disadvantages:

1. Since it is difficult to actually expand the pads 20 into the hollow portion 12a of the outer brush 12, it is difficult to pass the brush core 11 through the hollow portion 12a of the outer brush 12.

2. Since it is difficult to smoothly pass the brush core 11 through the hollow portion 12a of the outer brush 12, the outer brush 12 is easily damaged when the brush core 11 passes through the hollow portion 12a of the outer brush 12.

3. Since the material of the pads 20 is the same as the outer brush 12, it is difficult to draw the pads 20 out of the hollow portion 12a of the outer brush 12. Thus, the pads 20 are easily damaged.

SUMMARY OF THE INVENTION

In order to address the disadvantages of the aforementioned assembly method for a post-CMP cleaning brush, the invention provides an apparatus that can assemble the post-CMP cleaning brush more easily.

Another purpose of this invention is to provide a method for assembling a post-CMP cleaning brush without damaging its outer brush.

Accordingly, the invention provides an apparatus for assembling a post-CMP cleaning brush having a brush core and an outer brush. The outer brush is provided with a hollow portion, and the apparatus comprises a base, a fixed member, a sliding member, a plurality of posts, and an actuating device.

The base holds the brush core and the outer brush, and the fixed member is disposed on the base. The sliding member is disposed on the base in a manner such that it is located at the opposite side of the fixed member relative to the outer brush disposed on the base. The posts, disposed on the sliding member, pass through the fixed member and the hollow portion of the outer brush so as to assist the brush core in passing through the hollow portion of the outer brush. The actuating device connects with the brush core so as to pass the brush core through the hollow portion of the outer brush and separate the posts, inserted into the outer brush, from the outer brush.

In a preferred embodiment, the apparatus further comprises a guiding member, connecting with the brush core, to make it easier to pass the brush core through the hollow portion of the outer brush.

Furthermore, the guiding member is provided with a plurality of grooves corresponding to the posts respectively. Thus, the guiding member slides along the posts by the grooves when the guiding member, connecting with the brush core, passes through the hollow portion of the outer brush.

Furthermore, the guiding member is provided with a catch rod, and the fixed member is provided with a first through hole for the catch rod passing through so as to prevent the brush core, inserted into the outer brush, from separating from the outer brush.

In another preferred embodiment, the fixed member is provided with a second through hole for the brush core passing through.

In another preferred embodiment, the fixed member is provided with a plurality of third through holes for the posts passing through.

In another preferred embodiment, the apparatus further comprises a hinge and a plate. The hinge is disposed on the sliding member. The plate connects with the hinge in a manner such that it rotates relative to the sliding member so that the posts separate from the outer brush when the actuating device separates from the brush core.

In another preferred embodiment, the actuating device comprises a connecting member, a cylinder, an air valve, and a pressure regulator valve. The connecting member connects with the brush core. The cylinder connects with the connecting member so as to push the brush core forward via the connecting member. The air valve communicates with the cylinder so as to actuate the cylinder. The pressure regulator valve communicates with the air valve.

In another preferred embodiment, the sliding member is provided with a plurality of first basic holes for disposal of the posts thereon.

In another preferred embodiment, the fixed member is provided with a plurality of second basic holes, and the sliding member is provided with a plurality of supports. The apparatus further comprises a plurality of link rods disposed on the base in a manner such that the link rods are inserted into the second basic holes and held by the supports of the sliding member.

In another preferred embodiment, the base is provided with a concave portion for disposal of the outer brush thereon.

In another preferred embodiment, this invention provides a method for assembling a post-CMP cleaning brush. The method comprises the following steps:

(a) providing the post-CMP cleaning brush having a brush core and an outer brush, wherein the outer brush is provided with a hollow portion;

(b) providing an assembly apparatus having a base, a fixed member, a sliding member, a plurality of posts, an actuating device, and a guiding member;

(c) disposing the outer brush on the base and inserting the posts into the hollow portion of the outer brush;

(d) moving the sliding member so as to pass the posts through the hollow portion of the outer brush;

(e) connecting the guiding member and the brush core;

(f) inserting one end, connecting with the guiding member, of the brush core into the sliding member while disposing the other end, connecting-with the actuating device, of the brush core on the base;

(g) passing the brush core through the hollow portion of the outer brush by the actuating device;

(h) separating the guiding member from the brush core, and passing the guiding member through the fixed member; and (i) drawing the posts out of the hollow portion of the outer brush along with the sliding member by the actuating device so that the brush core is adjacent to the outer brush to complete the assembly of the post-CMP cleaning brush.

Furthermore, the posts are made of plastic steel.

BRIEF DESCRIPTION OF THE DRAWINGS

The invention is hereinafter described in detail with reference to the accompanying drawings in which:

FIG. 2a, FIG. 2b, FIG. 2c and FIG. 2d are schematic views of a conventional method for assembling the post-CMP cleaning brush as shown in FIG. 1b;

FIG. 5a is a schematic view that shows a sliding member in FIG. 3;

FIG. 5b is a schematic view that shows a post in FIG. 3;

FIG. 5c is a schematic view that shows a guiding member in FIG. 3;

FIG. 5d is a schematic view that shows a connecting member in FIG. 3;

DETAILED DESCRIPTION OF THE INVENTION

Figure 1A:
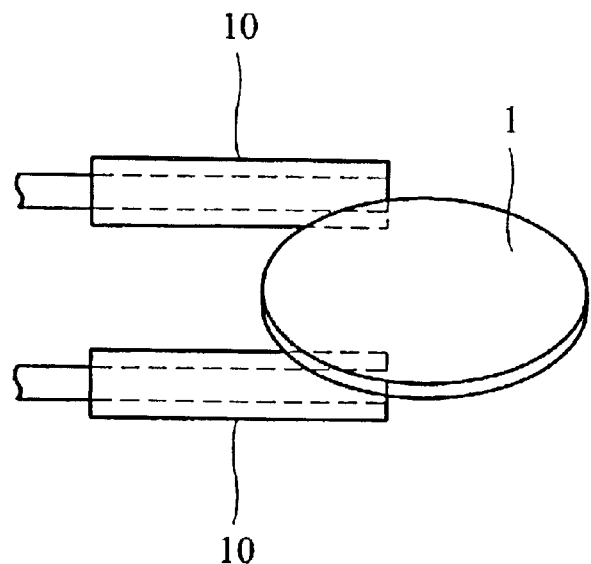
FIG. 1a is a schematic view of a cleaning system.
Figure 1B:
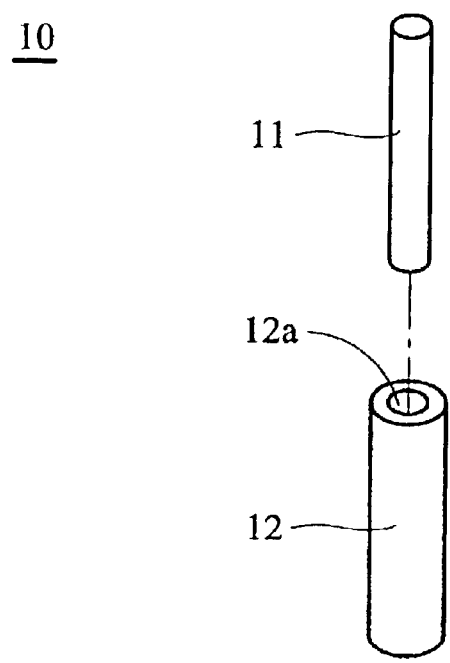
FIG. 1b is a schematic view of a post-CMP cleaning brush.
Figure 3:
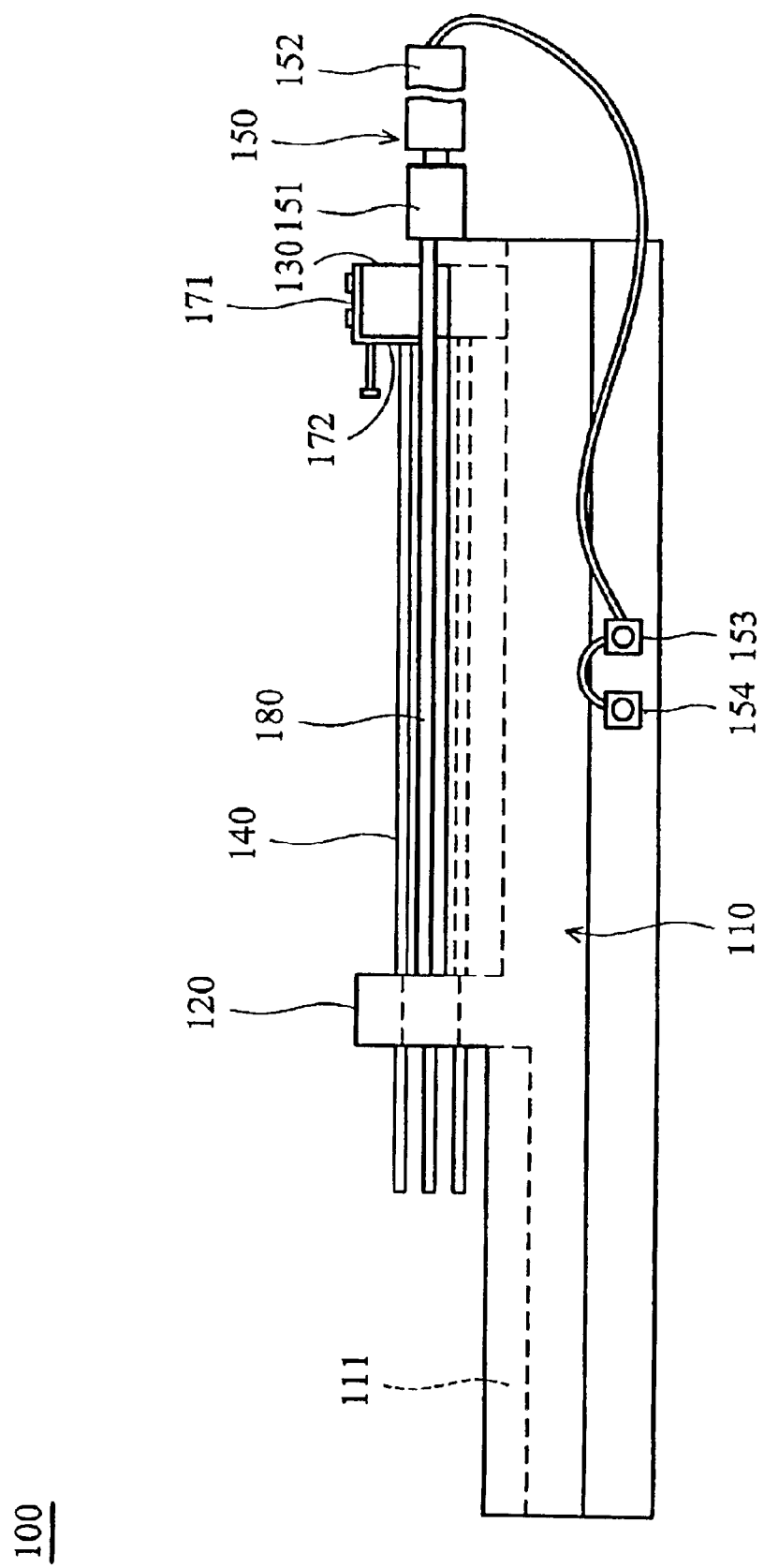
FIG. 3 is a schematic view that shows an assembly apparatus as disclosed in this invention.

Referring to FIG. 3, an apparatus 100 as disclosed in this invention is applied for a post-CMP cleaning brush 10 as shown in FIG. 1b. The post-CMP cleaning brush 10 is provided with a brush core 11 and an outer brush 12. The outer brush 12 is provided with a hollow portion 12a.

As shown in FIG. 3, the apparatus 100 comprises a base 110, a fixed member 120, a sliding member 130, six posts 140, an actuating device 150, a guiding member 160, a hinge 171, a plate 172, and two link rods 180. It is noted that only three posts 140 and only one link rod 180 are shown in FIG. 3. In addition, the guiding member 160 is shown in FIG. 5c.

Figure 4B:
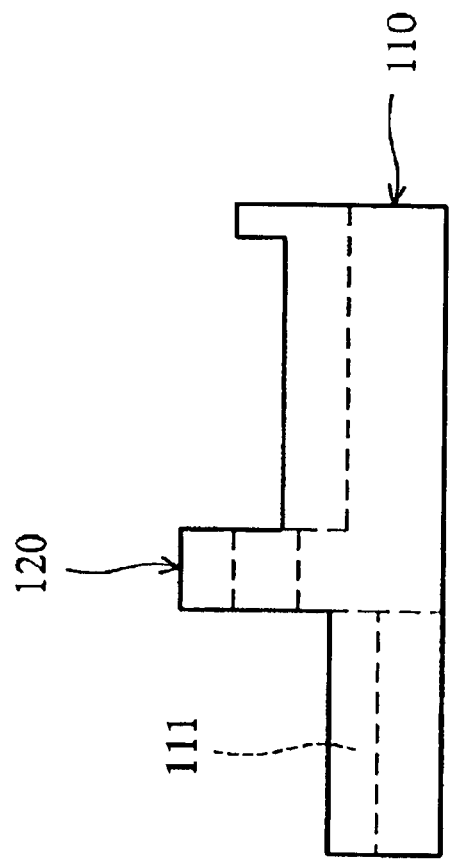
FIG. 4a and FIG. 4b are schematic views that show a base and a fixed member in FIG. 3.
Figure 4A:
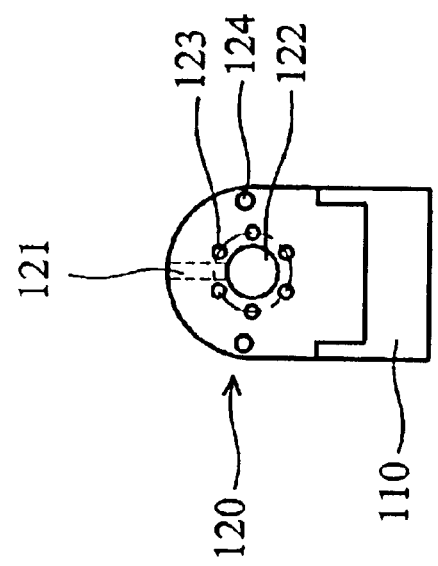

Referring to FIG. 4a and FIG. 4b, the base 110 is used to hold the brush core 11 and the outer brush 12, and is provided with a concave portion 111 for the outer brush 12 disposing thereupon. The fixed member 120 is disposed on the base 110, and is provided with a first through hole 121, a second through hole 122, six third through holes 123, and two second basic holes 124. The second through hole 122 is for the brush core 11 in passing through.

Referring to FIG. 3 and FIG. 5a, the sliding member 130 is disposed on the base 110 in a slidable manner. The sliding member 130 is located at the opposite side of the fixed member 120 relative to the outer brush 12 disposed on the base 110. The sliding member 130 is provided with six basic holes 131 and two supports 132.

Referring to FIG. 3 and FIG. 5b, the posts 140 are disposed on the first basic holes 131 of the sliding member 130 in a manner such that they pass through the third through holes 123 of the fixed member 120. When the outer brush 12 is disposed on the base 110, the posts 140 insert into the hollow portion 12a of the outer brush 12 so as to assist the brush core 11 in passing through the hollow portion 12a of the outer brush 12.

Referring to FIG. 3, the actuating device 150 comprises a connecting member 151, a cylinder 152, an air valve 153, and a pressure regulator valve 154. As shown in FIG. 5d, the connecting member 151 connects with the brush core 11 disposed on the base 110. The cylinder 152 connects with the connecting member 151 so as to push the brush core 11, disposed on the base 110, forward via the connecting member 151. The air valve 153 communicates with the cylinder 152 so as to actuate the cylinder 152. The pressure regulator valve 154 communicates with the air valve 153 so as to regulate the pressure of the cylinder 152. By such arrangement, the actuating device 150 can pass the brush core 11, disposed on the base 110, through the hollow portion 12a of the outer brush 12 and separate the posts 140, inserted into the outer brush 12, from the outer brush 12.

Referring to FIG. 5c, the guiding member 160 connects with the brush core 11, and assists the brush core 11 in passing through the hollow portion 12a of the outer brush 12. The guiding member 160 is provided with a plurality of grooves 161 and a catch rod 162. Each of the grooves 161 corresponds to the posts 140 respectively. Thus, the guiding member 160 slides along the posts 140 by the grooves 161 when the guiding member 160, connecting with the brush core 11, passes through the hollow portion 12a of the outer brush 12. The catch rod 162 can insert into the brush core 11 to combine the guiding member 160 and the brush core 11. Also, the catch rod 162 can pass through the first through hole 121 of the fixed member 120 so as to prevent the brush core 11, inserted into the outer brush 12, from separating from the outer brush 12.

Figure 6B:
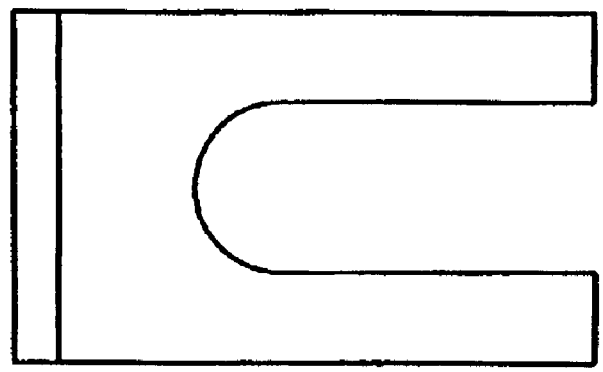
FIG. 6a and FIG. 6b are schematic views that show a plate in FIG. 3.
Figure 6A:
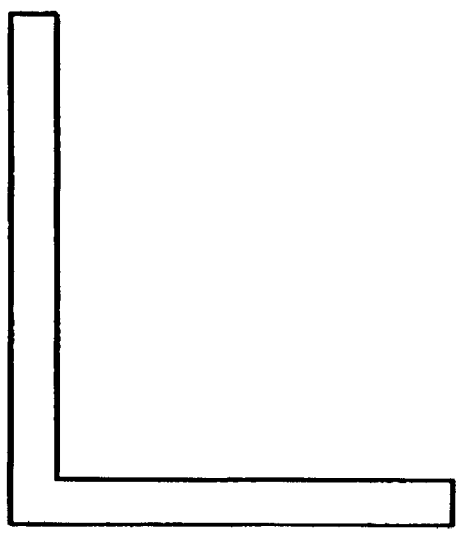

Referring to FIG. 3, the hinge 171 is disposed on the sliding member 130. As shown in FIG. 6a and FIG. 6b, the plate 172 connects with the hinge 171 in a manner such that it can rotate relative to the sliding member 130 so that the posts 140 separate from the outer brush 12 when the actuating device 150 separates from the brush core 11.

Referring to FIG. 3, the link rods 180 are disposed on the base 110 in a manner such that the link rods 180 are inserted into the second basic holes 124 of the fixed member 120 and held by the supports 132 of the sliding member 130.

The structure of the apparatus 100 is described as above, and a post-CMP cleaning brush assembly method, as disclosed in this invention, is described as follows.

Figure 7A:
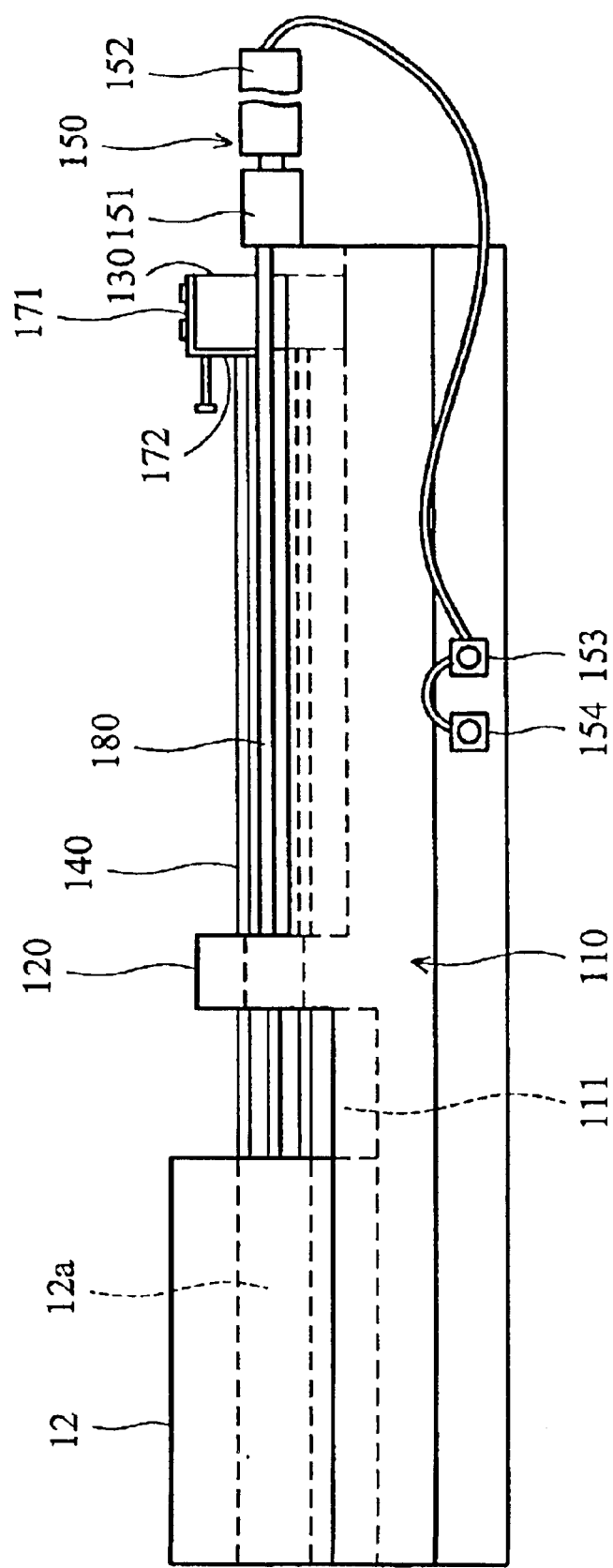
FIG. 7a, FIG. 7b, FIG. 7c, FIG. 7d, FIG. 7e, FIG. 7f, FIG. 7g, FIG. 7h and FIG. 7i are schematic views of a method for assembling a post-CMP cleaning brush as disclosed in this invention.
Figure 7B:
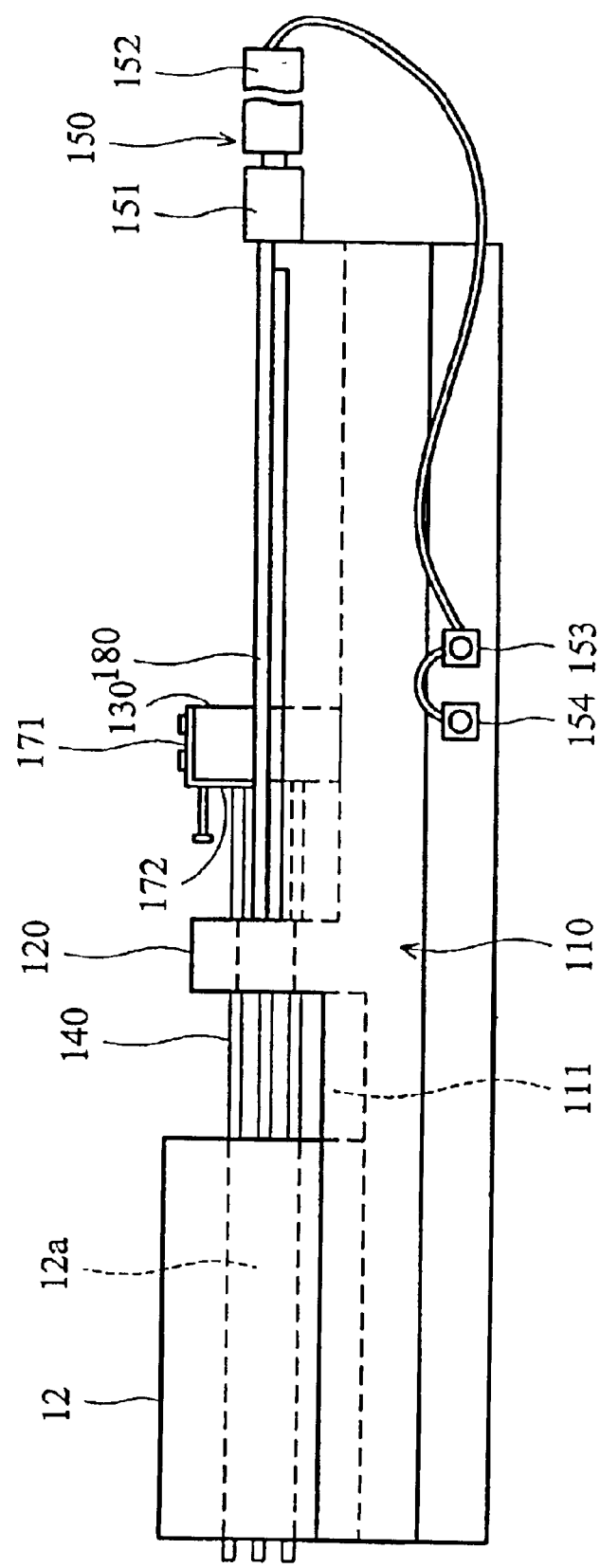
Figure 7C:
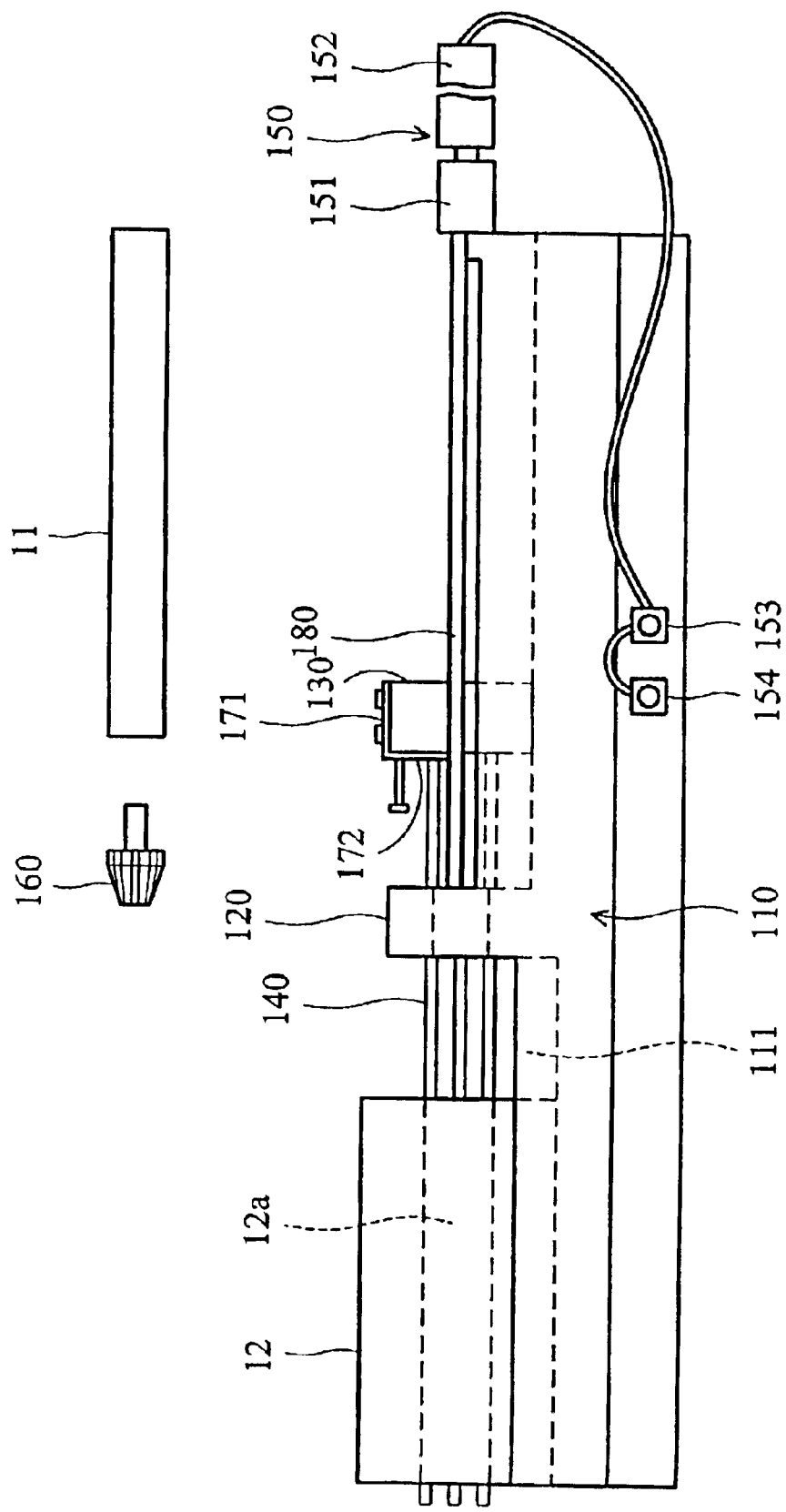
Figure 7D:
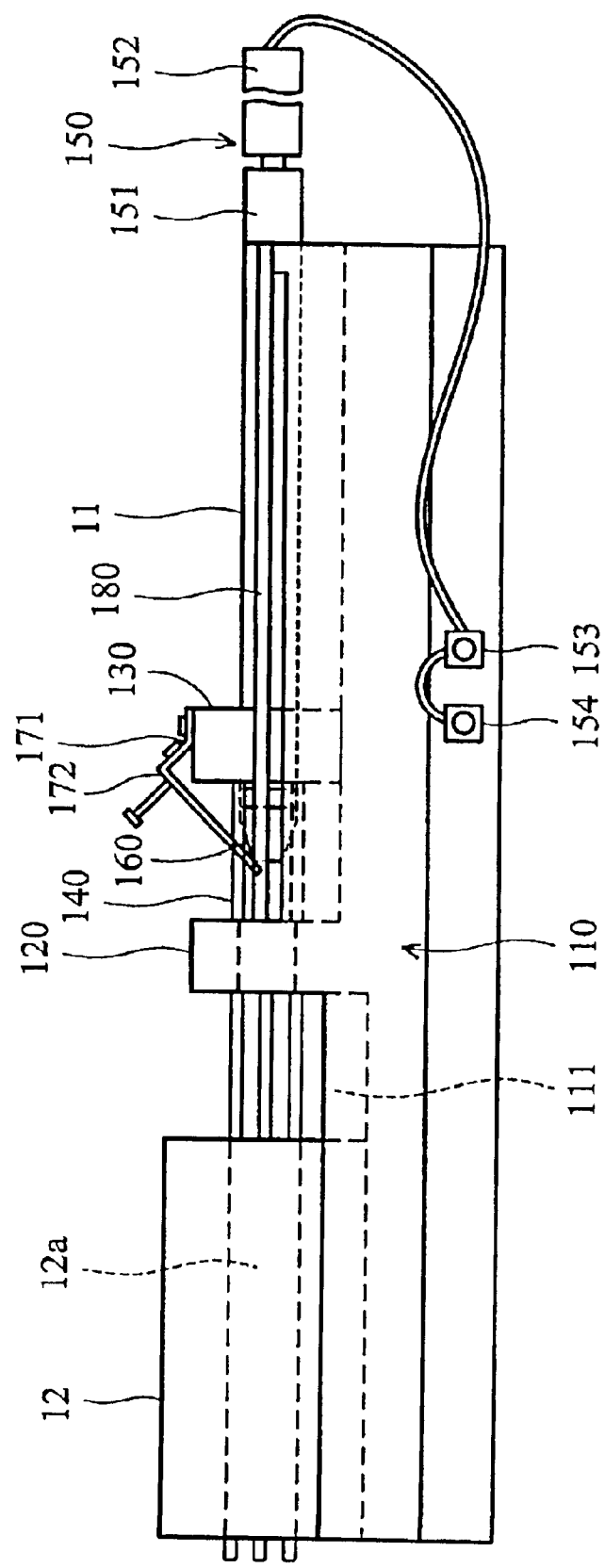
Figure 7E:
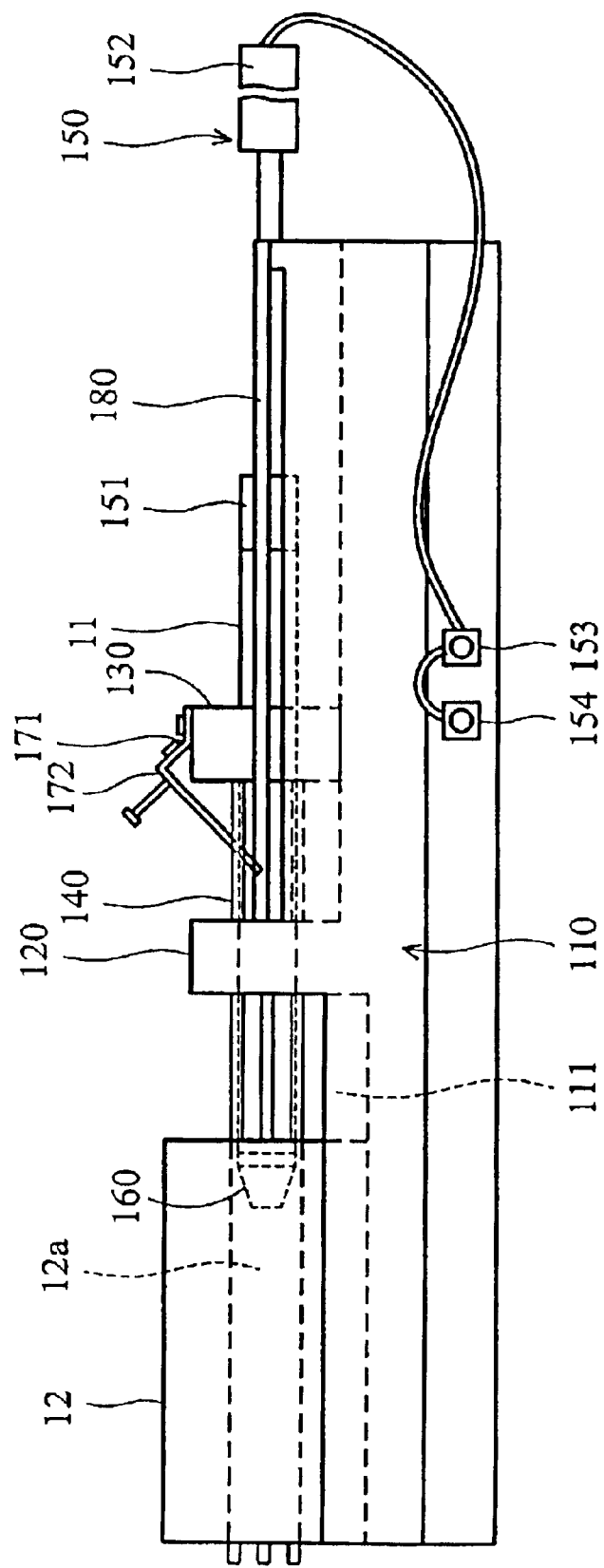
Figure 7F:
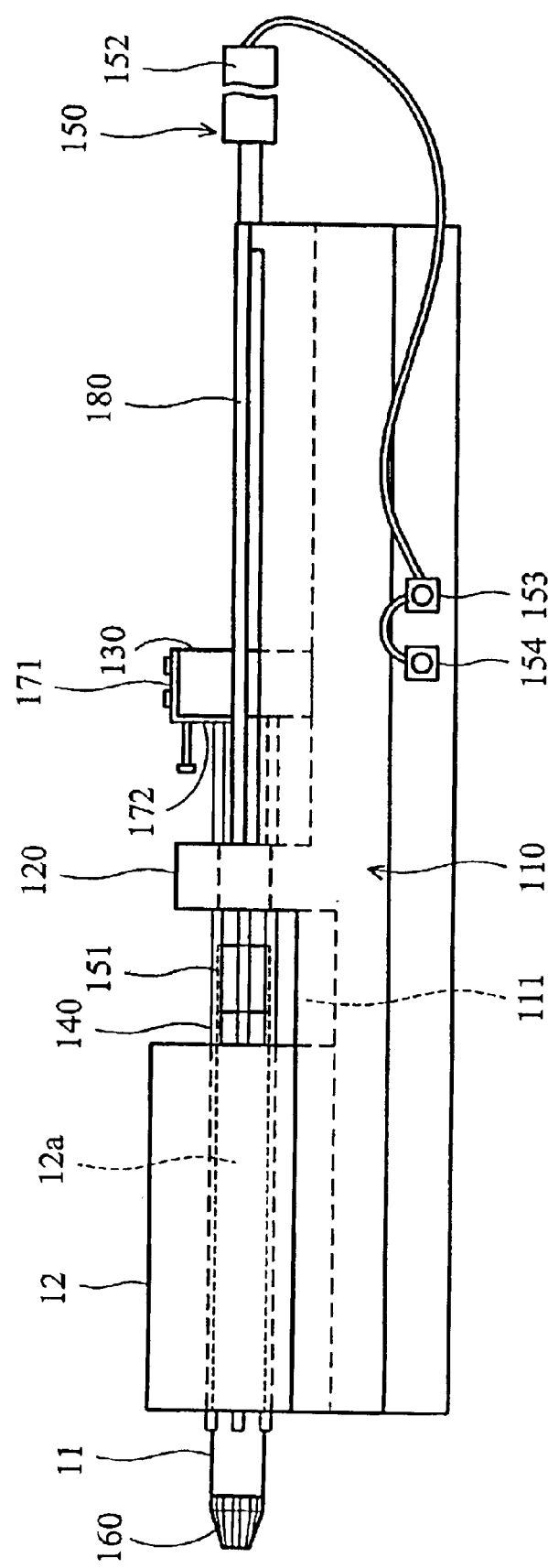
Figure 7G:
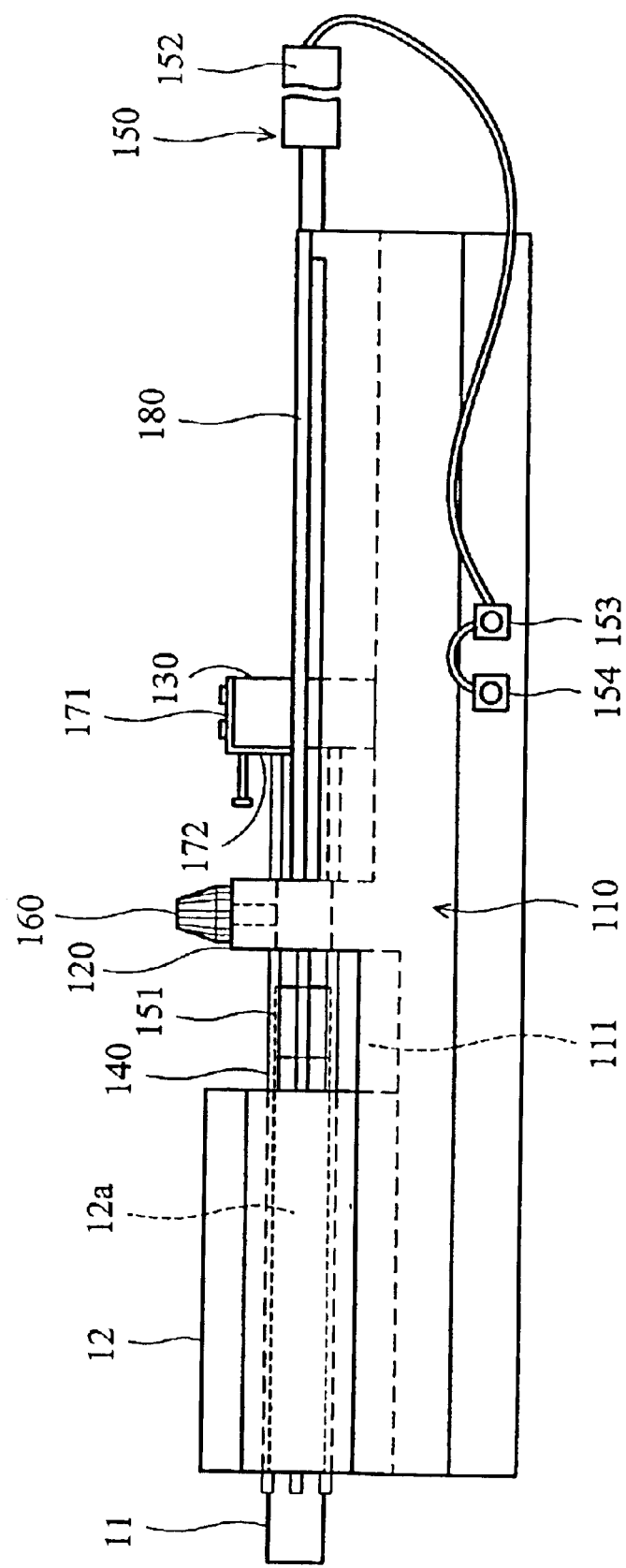
Figure 7H:
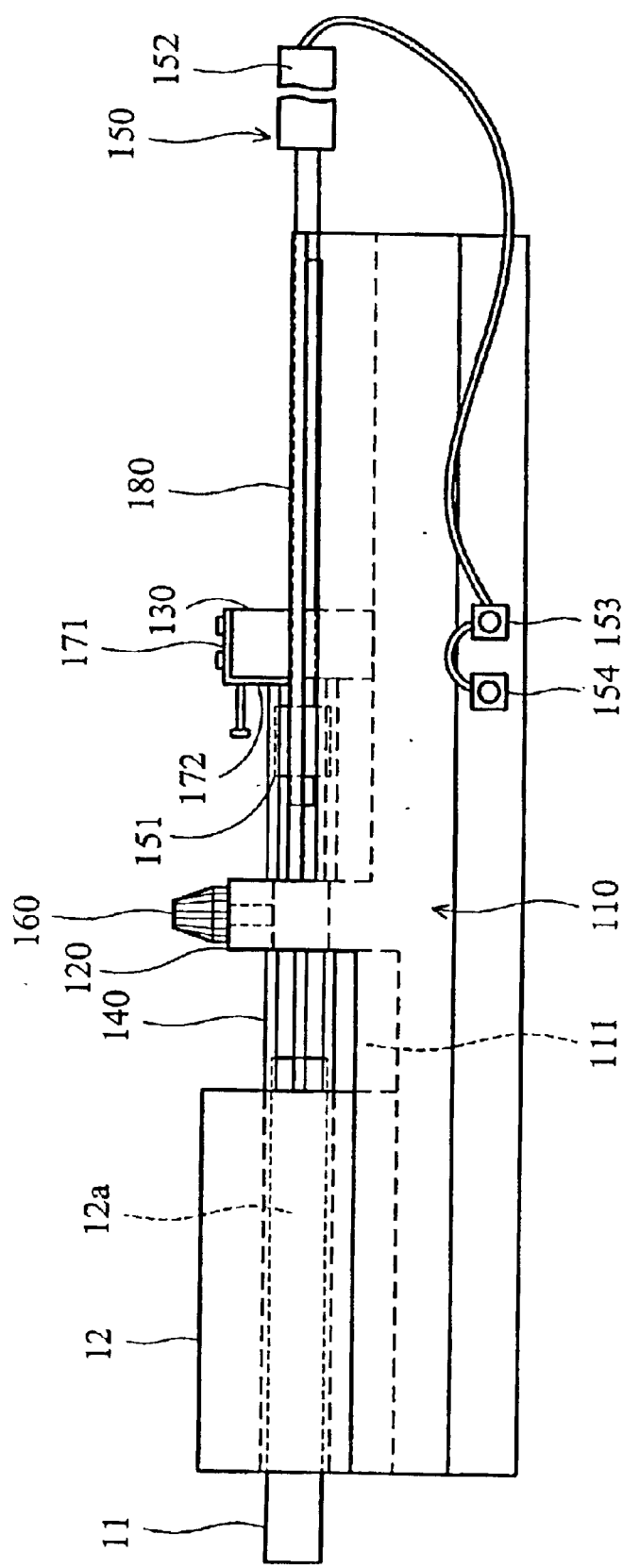
Figure 7I:
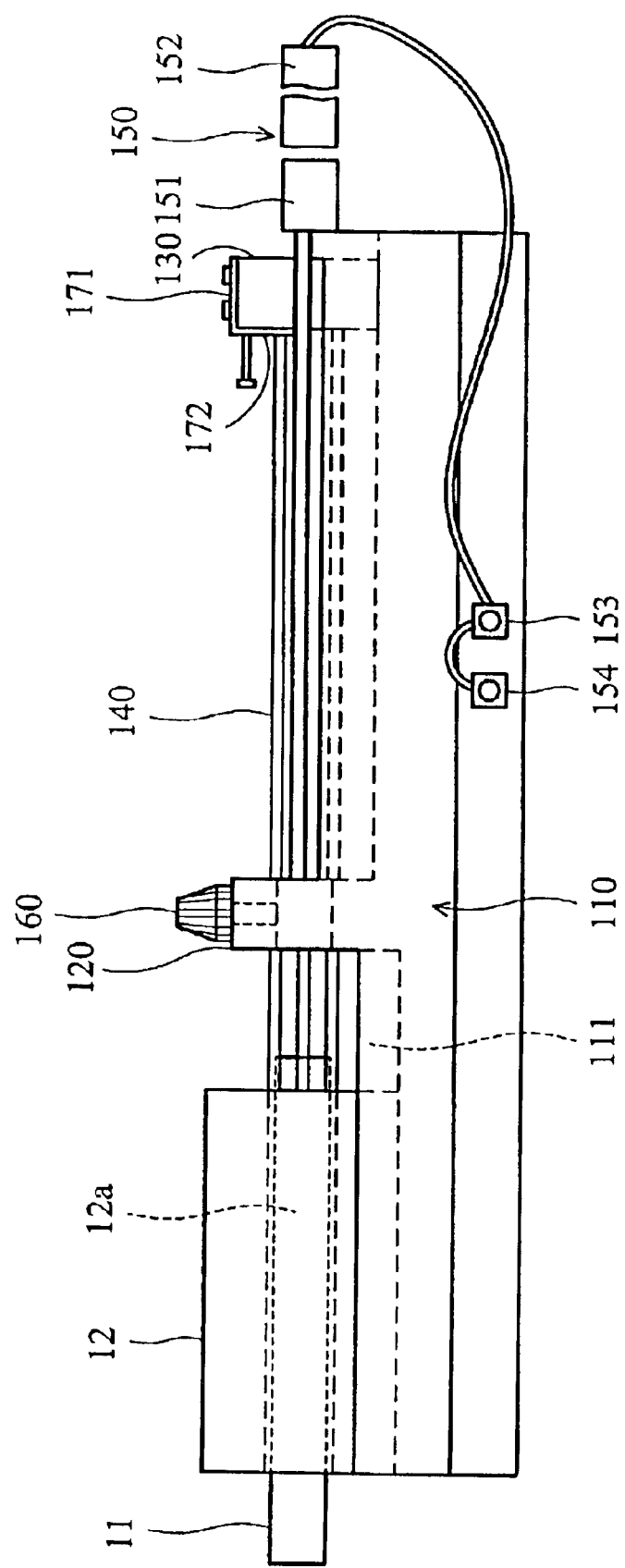

Referring to FIG. 7a, FIG. 7b, FIG. 7c, FIG. 7d, FIG. 7e, FIG. 7f, FIG. 7g, FIG. 7h, and FIG. 7i, the assembly method comprises the following steps. First, as shown in FIG. 7a, the outer brush 12 is disposed on the concave portion 111 of the base 110, and the front ends of the posts 140 are inserted into the hollow portion 12a of the outer brush 12. Then, as shown in FIG. 7b, the sliding member 130 is moved so as to pass the posts 140, inserted into the outer brush 12, through the hollow portion 12a of the outer brush 12. The guiding member 160 is connected with the brush core 11 as shown in FIG. 7c. Subsequently, as shown in FIG. 7d, one end, connecting with the guiding member 160, of the brush core 11 is inserted into the sliding member 130 while the other end, connecting with the connecting member 151 of the actuating device 150, of the brush core 11 is disposed on the base 110. Then, the air valve 153 of the actuating device 150 is actuated so as to move the cylinder 152 of the actuating device 150 forward. Thus, the brush core 11 moves forward in passing through the hollow portion 12a of the outer brush 12 as shown in FIG. 7e and FIG. 7f. Subsequently, as shown in FIG. 7g, the guiding member 160 is separated from the brush core 11, and the catch rod 162 of the guiding member 160 passes through the first through hole 121 of the fixed member 120. Finally, the air valve 153 of the actuating device 150 is re-actuated so as to move the cylinder 152 of the actuating device 150 backward. Thus, the posts 140 are drawn out of the hollow portion 12a of the outer brush 12 along with the sliding member 130 as shown in FIG. 7h. As a result, the brush core 11 is adjacent to the outer brush 12 to complete the assembly of the post-CMP cleaning brush as shown in FIG. 7i.

It is noted that in FIG. 7g, the catch rod 162 of the guiding member 160 passes through the fixed member 120 so as to prevent the brush core 11, inserted into the outer brush 12, from drawing out of the outer brush 12. However, the catch rod 162 does not interfere with the posts 140 to be drawn out of the outer brush 12. In addition, when the cylinder 152 moves backward, the plate 172 is located between the sliding member 130 and the connecting member 151 in FIG. 7h so that the sliding member 130 can move backward along with the connecting member 151.

Furthermore, the posts 140 may be made of plastic steel so that the hollow portion 12a of the outer brush 12 can be actually expanded by the posts 140. In addition, since the material of the posts 140 is not the same as the outer brush 12, the posts 140 do not interfere with the outer brush 12 so as to damage the outer brush 12 when the posts 140 are drawn out of the hollow portion 12a of the outer brush 12.

In addition, the number of the posts 140 is not limited to six as long as the posts 140 can actually assist in the assembly of the brush 10.

As stated above, by the assembly apparatus and the method of this invention, the post-CMP cleaning brush can be easily assembled without damaging its outer brush.

While the invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. An apparatus for assembling a post-CMP cleaning brush having a brush core and an outer brush, wherein the outer brush is provided with a hollow portion, and the apparatus comprises:

a base for holding the brush core and the outer brush;

a fixed member, disposed on the base, having a through hole for the brush core to pass through;

a sliding member disposed on the base in a manner such that it is located at the opposite side of the fixed member relative to the outer brush disposed on the base;

a plurality of posts, disposed on the sliding member, passing through the fixed member and the hollow portion of the outer brush so as to assist the brush core in passing through the hollow portion of the outer brush; and an actuating device connecting with the brush core so as to pass the brush core through the hollow portion of the outer brush and separate the posts, inserted into the outer brush, from the outer brush.

2. The apparatus as claimed in claim 1, further comprising:

a guiding member, connecting with the brush core, to assist the brush core in passing through the hollow portion of the outer brush.

3. The apparatus as claimed in claim 2, wherein the guiding member is provided with a plurality of grooves corresponding to the posts respectively so that the guiding member slides along the posts by the grooves when the guiding member, connecting with the brush core, passes through the hollow portion of the outer brush.

4. The apparatus as claimed in claim 2, wherein the guiding member is provided with a catch rod, and the fixed member is provided with a through hole for the catch rod to pass through so as to prevent the brush core, inserted into the outer brush, from separating from the outer brush.

5. The apparatus as claimed in claim 1, wherein the fixed member is provided with a plurality of through holes for the posts to pass through.

6. The apparatus as claimed in claim 1, further comprising:

a hinge disposed on the sliding member; and a plate connecting with the hinge in a manner such that it rotates relative to the sliding member so that the posts separate from the outer brush when the actuating device separates from the brush core.

7. The apparatus as claimed in claim 1, wherein the actuating device comprises:
   a connecting member connecting with the brush core; and
   a cylinder connecting with the connecting member so as to push the brush core forward via the connecting member.

8. The apparatus as claimed in claim 7, wherein the actuating device further comprises:
   an air valve communicating with the cylinder so as to actuate the cylinder; and
   a pressure regulator valve communicating with the air valve.

9. The apparatus as claimed in claim 1, wherein the sliding member is provided with a plurality of basic holes for disposal of the posts thereon.

10. The apparatus as claimed in claim 1, wherein the fixed member is provided with a plurality of basic holes, and the sliding member is provided with a plurality of supports.

11. The apparatus as claimed in claim 10, further comprising:
    a plurality of link rods disposed on the base in a manner such that the link rods are inserted into the basic holes and held by the supports of the sliding member.

12. The apparatus as claimed in claim 10, further comprising:
    a plurality of link rods disposed on the base in a manner such that the link rods are inserted into the basic holes and held by the supports of the sliding member.

13. The apparatus as claimed in claim 1, wherein the base is provided with a concave portion for disposal of the outer brush thereon.

14. A method for assembling a post-CMP cleaning brush comprising:
    (a) providing the post-OMP cleaning brush having a brush core and an outer brush, wherein the outer brush is provided with a hollow portion;
    (b) providing an assembly apparatus having a base, a fixed member, a sliding member, a plurality of posts, an actuating device, and a guiding member;
    (c) disposing the outer brush on the base and inserting the posts into the hollow portion of the outer brush;
    (d) moving the sliding member so as to pass the posts through the hollow portion of the outer brush;
    (e) connecting the guiding member and the brush core;
    (f) inserting one end, connecting with the guiding member, of the brush core into the sliding member while disposing the other end, connecting with the actuating device, of the brush core on the base;
    (g) passing the brush core through the hollow portion of the outer brush by the actuating device;
    (h) separating the guiding member from the brush core, and passing the guiding member through the fixed member; and
    (i) drawing the posts out of the hollow portion of the outer brush along with the sliding member by the actuating device so that the brush core is adjacent to the outer brush to complete the assembly of the post-OMP cleaning brush.

15. The method as claimed in claim 14, wherein the posts are made of plastic steel.

16. An apparatus for assembling a post-CMP cleaning brush having a brush core and an outer brush, wherein the outer brush is provided with a hollow portion, and the apparatus comprises:
    a base for holding the brush core and the outer brush;
    a fixed members disposed on the base;
    a sliding member disposed on the base in a manner such that it is located at the opposite side of the fixed member relative to the outer brush disposed on the base;
    a plurality of posts, disposed on the sliding member, passing through the fixed member and the hollow portion of the outer brush so as to assist the brush core in passing through the hollow portion of the outer brush; and an actuating device connecting with the brush core so as to pass the brush core through the hollow portion of the outer brush and separate the posts, inserted into the outer brush, from the outer brush,
    wherein the fixed member is provided with a plurality of basic holes, and the sliding member is provided with a plurality of supports.

* * * * *